United States Patent
Noguchi et al.

(10) Patent No.: US 11,746,227 B2
(45) Date of Patent: Sep. 5, 2023

(54) THERMOSETTING RESIN COMPOSITION, CURED PRODUCT THEREOF, AND PRINTED WIRING BOARD

(71) Applicant: TAIYO HOLDINGS CO., LTD., Hiki-gun (JP)

(72) Inventors: Tomotaka Noguchi, Hiki-gun (JP); Yasuyo Kanazawa, Hiki-gun (JP); Eiji Harima, Hiki-gun (JP); Yasuaki Arai, Hiki-gun (JP)

(73) Assignee: TAIYO HOLDINGS CO., LTD., Hiki-gun (JP)

( * ) Notice: Subject to any disclaimer, the term of this patent is extended or adjusted under 35 U.S.C. 154(b) by 446 days.

(21) Appl. No.: 16/962,707

(22) PCT Filed: Jan. 15, 2019

(86) PCT No.: PCT/JP2019/000832
§ 371 (c)(1),
(2) Date: Jul. 16, 2020

(87) PCT Pub. No.: WO2019/142752
PCT Pub. Date: Jul. 25, 2019

(65) Prior Publication Data
US 2020/0354564 A1 Nov. 12, 2020

(30) Foreign Application Priority Data
Jan. 16, 2018 (JP) .................... 2018-005236

(51) Int. Cl.
*C08L 63/00* (2006.01)
*C08G 59/50* (2006.01)
(Continued)

(52) U.S. Cl.
CPC .............. *C08L 63/00* (2013.01); *C08G 59/50* (2013.01); *C08K 3/36* (2013.01); *H05K 1/0353* (2013.01);
(Continued)

(58) Field of Classification Search
CPC ...... H05K 3/0094; H05K 1/03; H05K 1/0313; H05K 1/0353; H05K 1/0373; C08L 63/00–10
See application file for complete search history.

(56) References Cited

U.S. PATENT DOCUMENTS

| 6,010,768 A | 1/2000 | Yasue et al. |
| 2003/0129383 A1 | 7/2003 | Yamamoto et al. |
| 2018/0142057 A1* | 5/2018 | Oota ............... C08J 5/042 |

FOREIGN PATENT DOCUMENTS

| CN | 1163234 A | 12/1997 |
| CN | 106916261 A | 7/2017 |

(Continued)

OTHER PUBLICATIONS

Translation of KR101564197B1 from IP.com (Year: 2015).*

(Continued)

*Primary Examiner* — Kregg T Brooks
*Assistant Examiner* — David R. Foss
(74) *Attorney, Agent, or Firm* — Oblon, McClelland, Maier & Neustadt, L.L.P.

(57) ABSTRACT

Provided is a thermosetting resin composition which can suppress liquid dripping or bleeding from generating even when used for filling a hole in a printed wiring board having a large opening diameter of a hole part such as a through hole, and in particular, which can suppress cracks from generating even when used for filling a hole in a multilayer printed wiring board having a conductive part and an insulating part on the inner wall of a hole part such as a (Continued)

through hole. The thermosetting resin composition according to the present invention has a viscosity ratio R expressed by formula $V_2/V_1$ in the range of $5.0 \times 10^{-2}$ to $1.0 \times 10^2$, wherein $V_1$ (dPa·s) is the viscosity measured by a cone-flat plate type rotational viscometer (cone-plate type) in accordance with JIS-Z 8803:2011 and $V_2$ (dPa·s) is the minimum value of the melt viscosity measured at 60° C. to 100° C. in accordance with JIS-K7244-10:2005, and a pencil hardness of HB or more measured by a pencil hardness test according to JIS-K5600-5-4:1999 in a state of heating at 100° C. for 160 minutes.

20 Claims, 4 Drawing Sheets

(51) Int. Cl.
  *H05K 1/03* (2006.01)
  *H05K 3/00* (2006.01)
  *C08K 3/36* (2006.01)
  *C08K 3/26* (2006.01)
(52) U.S. Cl.
  CPC ..... *H05K 1/0373* (2013.01); *C08K 2003/265* (2013.01); *H05K 3/0094* (2013.01)

(56) References Cited

FOREIGN PATENT DOCUMENTS

| | | |
|---|---|---|
| CN | 106916262 A | 7/2017 |
| JP | 10-75027 A | 3/1998 |
| JP | 11-302504 A | 11/1999 |
| JP | 2001-19834 A | 1/2001 |
| JP | 2002-141662 A | 5/2002 |
| JP | 2005-251895 A | 9/2005 |
| JP | 2007-509487 A | 4/2007 |
| JP | 2012-256636 A | 12/2012 |
| JP | 2013-170223 A | 9/2013 |
| JP | 2015085637 A * | 5/2015 ............... B32B 7/12 |
| KR | 2002-0077398 A | 10/2002 |
| KR | 101564197 B1 * | 10/2015 |
| KR | 10-1573170 B1 | 11/2015 |
| WO | WO 02/44274 A1 | 6/2002 |
| WO | WO-2016182077 A1 * | 11/2016 ............. C08G 59/24 |

OTHER PUBLICATIONS

Translation of JP-2015085637-A from PatentScope (Year: 2015).*
Japanese Office Action dated Jul. 12, 2021 in Japanese Patent Application No. 2019-530111 (with English translation), citing document AO therein, 7 pages.
Office Action dated Jul. 20, 2020 in corresponding Korean Patent Application No. 10-2019-7022091 (with English Translation), citing documents AO and AP therein, 10 pages.
Chinese Office Action dated May 28, 2021 in Chinese Patent Application No. 201980000790.4 (with English translation), citing documents AO through AQ therein, 10 pages.
International Search Report dated Mar. 12, 2019 in PCT/JP2019/000832 filed on Jan. 15, 2019, citing documents AA, AB and AR-AV therein, 1 page.
Notice of Reasons for Refusal dated May 13, 2020 in Japanese Patent Application No. 2019-530111 (with English translation), citing documents AR-AV therein, 12 pages.

* cited by examiner

THERMOSETTING RESIN COMPOSITION, CURED PRODUCT THEREOF, AND PRINTED WIRING BOARD

CROSS-REFERENCE TO RELATED APPLICATIONS

This application is a national stage application of International Application No. PCT/JP2019/000832, filed Jan. 15, 2019, which is based upon and claims the benefit of priority to Japanese Patent Application No. 2018-005236, filed Jan. 16, 2018. The entire contents of these applications are incorporated herein by reference.

BACKGROUND OF THE INVENTION

Field of the Invention

The present invention relates to a thermosetting resin composition, and more particularly to a thermosetting resin composition which can be suitably used as a filling material for filling a penetrating hole such as a through hole or a recess part in a printed wiring board.

Background Art

Along with downsizing/high functionalization of electronic devices, there is a demand for printed wiring boards to have finer patterns, smaller mounting areas, and higher density of component mounting. For this reason, use is made to a double-sided substrate provided with penetrating holes for forming interlayer connections for electrically connecting different wiring layers, i.e. through holes, or a multilayer substrate such as a build-up wiring board in which an insulating layer and a conductor circuit are sequentially formed on a core material and are laminated by interlayer connections such as via holes to form multilayers. Then, area array mounting such as BGA (ball grid array) and LGA (land grid array) is performed.

In such a printed wiring board, a recess part between conductor circuits on the surface or a hole part such as a through hole or a via hole having a wiring layer formed on the inner wall surface is generally subjected to a hole filling process with a thermosetting resin filling material. As the thermosetting resin filling material, generally used are an epoxy resin as a thermosetting resin component, an epoxy resin curing agent, and a thermosetting resin filling material containing an inorganic filler. For example, Patent Document 1 proposes as a thermosetting resin filling material having excellent filling properties and the like, a thermosetting resin filling material comprising a liquid epoxy resin, a liquid phenol resin, a curing catalyst, and 2 kinds of fillers.

In recent years, along with high functionalization of printed wiring boards, improvement of frequency characteristics has been made by removing excess portions that are irrelevant to conduction between layers from the plating film on the wall surfaces of through-holes and via holes. For example, Patent Document 2 proposes a printed wiring board having a hole part in which a through-hole or a via hole is partially drilled using a technique called a back drill method. Further, Patent Document 3 proposes providing a plating film only on a part of the wall surface of a through hole or a via hole.

PRIOR ART DOCUMENT

Patent Literature

Patent Document 1: JP 2001-019834 A1
Patent Document 2: JP 2007-509487 A1
Patent Document 3: JP 2012-256636 A1

SUMMARY OF THE INVENTION

Problem to be Solved by the Invention

In the through holes and the like of the printed wiring boards as described in Patent Documents 2 and 3, the opening diameter of the hole part on the side drilled with a drill is 0.5 to 0.8 mm, which is larger than the opening diameter of the hole part of an ordinary through hole and the like (0.2 to 0.3 mm). When a conventional thermosetting resin filling material is applied to a printed wiring board having such a large opening diameter of the hole part to fill the hole, a dent can be generated on the hole part surface filled with the filling material when curing process of the filling material was performed. That is, the curing process of the filling material is generally performed by curing the filling material with the printed wiring board placed in an upright state after the filling material is filled in the through hole or the like, and when the printed wiring board was placed upright after filling the filling material in the through-hole and the like with a large opening diameter of the hole part, the liquid easily drips before the filling material is cured, and the through hole is filled with an insufficient filling amount, which as a result, is considered to generate the dent on the surface of the filled opening portion. Further, bleeding occurs due to the resin and the like in the filling material during heating. When bleeding occurs, the resin and the like (cured product of the filling material) adheres to the surface of the printed wiring board when the filling material is cured, so that the resin and the like may flow into other opening portions.

In addition, when a conventional thermosetting resin filling material is applied to fill a hole such as a through hole having a structure in which no plating film or the like is formed on a part of the inner wall surface of the hole part or having an area which one part of the plating film is removed so that the insulating layer of the printed wiring board is exposed, cracks can be generated in the cured product of the filling material at the boundary between the plating film and the insulating layer when the filling material is cured.

Accordingly, the object of the present invention is to provide a thermosetting resin composition which suppresses the liquid dripping and bleeding even when in use for filling a hole in a printed wiring board having a large opening diameter of a hole part such as a through hole and in particular, which is capable of suppressing cracks from generating even when in use for filling a hole in a multi-layered printed wiring board having a conductive part and an insulating part on the inner wall of the hole part such as a through hole. Another object of the present invention is to provide a cured product formed using the thermosetting resin composition and a printed wiring board having the cured product.

Means for Solving the Problem

The present inventors have focused on the change in viscosity when a thermosetting resin composition is cured, and have acquired the knowledge that by using a thermosetting resin composition in which the viscosity at room temperature and the melt viscosity at the temperature of curing of the thermosetting resin composition are in a specific ratio and the surface hardness after curing is equal to or greater than a certain value, it is possible to suppress liquid dripping or bleeding from generating and also cracks in the cured product from generating even when the thermosetting resin composition was used for filling holes of a printed wiring board having a large opening diameter of a hole part such as a through hole or a multi-layered printed wiring board having a conductive part and an insulating part on the inner wall of the hole part. The present invention is based on such knowledge.

[1] A thermosetting resin composition according to the first embodiment of the present invention has a viscosity ratio R expressed by formula $V_2/V_1$ in the range of $5.0 \times 10^{-2}$ to $1.0 \times 10^2$, wherein $V_1$ (dPa·s) is the viscosity measured by a cone-flat plate type rotational viscometer (cone-plate type) in accordance with JIS-Z 8803:2011 and $V_2$ (dPa·s) is the minimum value of the melt viscosity measured at 60° C. to 100° C. by a parallel-plate oscillatory rheometer in accordance with JIS-K7244-10:2005, and a pencil hardness of HB or more measured by a pencil hardness test according to JIS-K5600-5-4:1999 in a state of heating at 100° C. for 160 minutes.

[2] The thermosetting resin composition according to the second embodiment of the present invention is the thermosetting resin composition of [1], wherein
the gel time at 110° C. measured in accordance with the hot plate method specified in JIS-C2161:2010 is within 30 minutes.

[3] The thermosetting resin composition according to the third embodiment of the present invention is the thermosetting resin composition of [1] or [2], comprising at least a thermosetting resin, a curing agent, and an inorganic filler.

[4] The thermosetting resin composition according to the fourth embodiment of the present invention is the thermosetting resin composition of any one of [1] to [3], used as a filling material for a penetrating hole or a recess part in a printed wiring board.

[5] A cured product according to the fifth embodiment of the present invention is obtained by curing the thermosetting resin composition of any one of [1] to [4].

[6] A printed wiring board according to the sixth embodiment of the present invention is characterized by comprising the cured product of [5].

Effect of the Invention

According to the present invention, it is possible to realize a thermosetting resin composition which suppresses liquid dripping and bleeding even when in use for filling a hole in a printed wiring board having a large opening diameter of a hole part such as a through hole and in particular, which is capable of suppressing cracks from generating even when in use for filling a hole in a multilayered printed wiring board having a conductive part and an insulating part on the inner wall of the hole part such as a through hole. According to another embodiment of the present invention, it is possible to realize a cured product formed using the above-described thermosetting resin composition and a printed wiring board having the cured product.

DETAILED DESCRIPTION OF THE INVENTION

<Thermosetting Resin Composition>

Figure 1A:
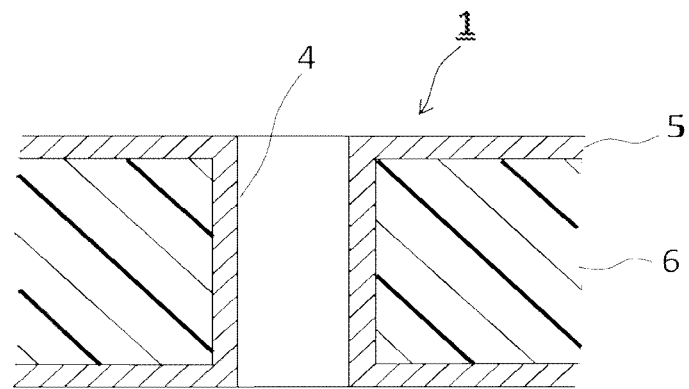
FIG. 1a is a schematic diagram illustrating a step of filling a penetrating hole of a printed wiring board using a thermosetting resin filling material.

The thermosetting resin composition according to the present invention is characterized of having a viscosity ratio R expressed by formula $V_2/V_1$ in the range of $5.0 \times 10^{-2}$ to $1.0 \times 10^2$, wherein $V_1$ (dPa·s) is the viscosity measured by a cone-flat plate type rotational viscometer (cone-plate type) in accordance with JIS-Z 8803:2011 and $V_2$ (dPa·s) is the minimum value of the melt viscosity measured at 60° C. to 100° C. by a parallel-plate oscillatory rheometer in accordance with JIS-K7244-10:2005, and a pencil hardness of HB or more measured by a pencil hardness test according to JIS-K5600-5-4:1999 in a state of heating at 100° C. for 160 minutes. Note that, in the present invention, viscosity $V_1$ is a value measured by using a cone-flat plate type rotational viscometer (cone-plate type), rotor 3°×R9.7 comprising a cone rotor (conical rotor) and a plate, from a 30 seconds value at 25° C. and 5 rpm, and minimum value of the melt viscosity $V_2$ is a value obtained by using a parallel-plate oscillatory rheometer (HAAKE RheoStress 6000 manufactured by ThermoFisher), metering 0.2 ml of the sample with a syringe and placing the sample on an aluminum disk with a diameter of 20 mm set at 30° C., setting the thickness of the sample to 0.5 mm, conducting preheating for 180 seconds at 30° C., and subsequently measuring under the measuring condition of temperature elevation rate of 5° C./min, measuring temperature of 30 to 150° C., frequency of 1 Hz, shear strain of 0.1740, and a strain control method. As a cone-flat plate type rotational viscometer (cone-plate type), for example, use can be made to TV-30 type (manufactured by Toki-Sangyo Co., Ltd., rotor 3°×R9.7).

Since a general thermosetting resin composition turns into a cured product as a result of progression of the curing reaction, the melt viscosity is considered to rise sharply along with the curing. On the other hand, since the resin component contained in the thermosetting resin composition softens by heating, the melt viscosity of the thermosetting resin composition decreases. The change in melt viscosity over time during curing of a typical thermosetting resin composition exhibits a complicated behavior in which the above-described viscosity increasing phenomenon accompanied by curing and the viscosity decreasing phenomenon accompanied by heating compete with each other. In the present invention, when a thermosetting resin composition having a pencil hardness of HB or more as determined by a pencil hardness test according to JIS-K5600-5-4:1999 when in the heated state at 100° C. for 160 minutes has a viscosity ratio R expressed by formula $V_2/V_1$ in the range of $5.0 \times 10^{-2}$ to $1.0 \times 10^2$, wherein $V_1$ is the viscosity before the thermosetting resin composition is cured and $V_2$ is the minimum value of the melt viscosity of the thermosetting resin composition at curing, it is possible to suppress the liquid dripping or bleeding from generating and also to suppress cracks from generating in a filled cured produce even if used for filling a penetrating hole or a recess part of a specific printed wiring board. Although the reason is not clear, it can be considered as follows.

That is, since the curing speed of a thermosetting resin composition having the viscosity ratio R (i.e., the value of $V_2/V_1$) which is the minimum value of the melt viscosity at the time of curing (i.e., the value of $V_2$) relative to the viscosity before curing (i.e., the value of $V_1$) of $5.0\times10^{-2}$ or more is considered not too slow, liquid dripping and bleeding are less likely to occur when a hole part with a large diameter is filled with a thermosetting resin and cured. On the other hand, since the curing speed of a thermosetting resin composition having a viscosity ratio R of $1.0\times10^2$ or less is not considered to be too fast, cracks are unlikely to occur in the cured product of the thermosetting resin composition at the boundary between the conductive part and the insulating layer. When a thermosetting resin composition is used to fill a hole in a printed wiring board having a conductive part and an insulating part on the inner wall of a hole part of a penetrating hole or a recess part, curing of the thermosetting resin composition in the portion in contact with the conductive part proceeds first, and curing of the thermosetting resin composition in the portion in contact with the insulating part proceeds later since the conductive part and the insulating part in contact with the thermosetting resin composition have different thermal conductivities. As a result, stress is applied to the portion cured later due to curing shrinkage of the portion which was previously cured, and a crack is considered to occur likewise. In the present invention, the viscosity ratio R represented by formula $V_2/V_1$ is in the range of $5.0\times10^{-2}$ to $1.0\times10^2$ and more preferably in the range of $1.0\times10^{-1}$ to $1.0\times10$.

The thermosetting resin composition of the present invention has the viscosity $V_1$ at 25° C. measured by a cone-flat plate type rotational viscometer (cone-plate type) in accordance with JIS-Z 8803:2011 is preferably in the range of 100 to 1000 dPa·s and more preferably in the range of 200 to 800 dPa·s from the viewpoint of workability when used for filling a hole part of a penetrating hole or a recess part of a printed wiring board.

Since a thermosetting resin composition having a viscosity ratio R in the range of $5.0\times10^{-2}$ to $1.0\times10^2$ and a pencil hardness of HB or more measured by a pencil hardness test according to JIS-K5600-5-4:1999 when in a heated state at 100° C. for 160 minutes is considered to have a curing speed in a more appropriate range, the thermosetting resin composition is less likely to cause liquid dripping, bleeding, or cracking when used for filling a hole in a printed wiring board having a conductive part and an insulating part on the inner wall of a hole part of a penetrating hole or a recess part. The pencil hardness is preferably 2H or more and more preferably 4H or more. On the other hand, the upper limit is preferably 6H or less. Specifically, the pencil hardness refers to the highest pencil hardness which is the pencil hardness of a coating film surface measured in accordance with JIS-K5600-5-4:1999 and which does not make a scratch to the coating film, the coating film surface obtained by applying a thermosetting resin composition to a copper solid substrate having a copper thickness of 35 μm which was washed with water after polishing with a buff roller and dried and heating the coating film surface in a hot-air circulation drying furnace at 100° C. for 160 minutes. The test shall be repeated 2 times, and if the results of the 2 tests differ by one or more unit, the test shall be abandoned and redone. Specifically, the drying conditions in the hot-air circulation type drying furnace is made by placing a sample such as a substrate provided with a coating film on the central part of the furnace by using a shelf plate or the like and keeping the temperature in the furnace constant within the range of 100° C.±5° C. by air circulation or duct adjustment. As for the hot air circulation type drying furnace, for example, DF610 manufactured by Yamato Science Co., Ltd. can be used. The thickness of the coating film after curing is not particularly limited, preferably 30 to 50 μm.

In the present invention, the gel time at 110° C. measured in accordance with the hot plate method specified in JIS-C2161:2010 is preferably within 30 minutes and more preferably 2 minutes or longer and 30 minutes or shorter. If the gel time is within the above range, the cracks in the cured product filled with the holes can be further more suppressed from generating, even when the composition was used to fill a penetrating hole or a recess part of a specific printed wiring board. Note that, in the present invention, the gel time refers to a time period from when the thermosetting resin composition is placed on a hot plate of a gelation tester which was set at a temperature of 110° C. using a hot-plate type gelation tester to the time until the thermosetting resin composition turns into a gel. In addition, the hot plate method specified in JIS-C2161:2010 refers to Method B specified in JIS-C2161:2010, 7.5.2.

In the thermosetting resin composition of the present invention, the type and blending ratio of each component can be appropriately adjusted so that the viscosity ratio R expressed by $V_2/V_1$, pencil hardness, and gel time fall within the above-described ranges. For example, appropriate adjustment may be made, but not necessarily limited by combinations of resins having high reactivity, compositions having high compatibility, steps, or the like.

The thermosetting resin composition having the characteristics as above preferably contains at least a thermosetting resin, a curing agent, and an inorganic filler. Each component will be described below.

The preferred thermosetting resin contained in the thermosetting resin composition of the present invention is not particularly limited, as long as it can be cured by heat; however, an epoxy resin can be preferably used. The epoxy resin can be used without limitation as long as it has two or more epoxy groups in one molecule. Examples thereof include bisphenol A type epoxy resin, bisphenol F type epoxy resin, hydrogenated bisphenol A type epoxy resin, brominated bisphenol A type epoxy resin, bisphenol S type epoxy resin, phenol novolac type epoxy resin, cresol novolac type epoxy resin, bisphenol A novolac type epoxy resin, biphenyl type epoxy resin, naphthol type epoxy resin, naphthalene type epoxy resin, dicyclopentadiene type epoxy resin, triphenylmethane type epoxy resin, alicyclic epoxy resin, aliphatic chain type epoxy resin, phosphorus-containing epoxy resin, anthracene type epoxy resin, norbornene type epoxy resin, adamantane type epoxy resin, fluorene type epoxy resin, amino phenol type epoxy resin, amino cresol type epoxy resin, alkylphenol type epoxy resin, and the like. One of the above-mentioned epoxy resins can be used or two or more in a combination.

The thermosetting resin composition of the present invention may also contain an epoxy resin having a bisphenol type skeleton. Examples of the epoxy resin having a bisphenol type skeleton include bisphenol A type epoxy resin, bisphenol F type epoxy resin, bisphenol E (AD) type epoxy resin, bisphenol S type epoxy resin, and the like, and among these, preferred are bisphenol A type epoxy resin, bisphenol F type epoxy resin, and bisphenol E (AD) type epoxy resin. The epoxy resin having a bisphenol skeleton may be any of liquid, semi-solid or solid, and is preferably liquid from the viewpoint of filling properties. Note that, the term "liquid" shall refer to a liquid state having fluidity at 20° C.

One of these epoxy resins having a bisphenol type skeleton may be used alone or two or more of these in a combination; however, preference is made to using a combination of two or more epoxy resins selected from bisphenol A type epoxy resin, bisphenol F type epoxy resin, and bisphenol E (AD) type epoxy resin, from the viewpoint of having excellent filling properties and as a result, having a better influence on the properties after curing. Examples of commercial products of these include jER828, jER834, and jER1001 (bisphenol A type epoxy resins) and jER807 and jER4004P (bisphenol F type epoxy resins) which are manufactured by Mitsubishi Chemical Corporation, and R710 (bisphenol E type epoxy resin) manufactured by Air Water Co., Ltd.

The thermosetting resin composition of the present invention may also contain a polyfunctional epoxy resin. Examples of the polyfunctional epoxy resin include a hydroxybenzophenone-type liquid epoxy resin, EP-3300E manufactured by ADEKA CORPORATION and the like; an aminophenol-type liquid epoxy resin (para-amino phenol-type liquid epoxy resin), jER630 manufactured by Mitsubishi Chemical Corporation, ELM-100 manufactured by Sumitomo Chemical Co., Ltd. and the like; a glycidylamine-type epoxy resin, jER604 manufactured by Mitsubishi Chemical Corporation, Epotote YH-434 manufactured by Nippon Steel & Sumikin Chemical Co., Ltd., and Sumi-epoxy ELM-120 manufactured by Sumitomo Chemical Co., Ltd.; a phenol novolac-type epoxy resin, DEN-431 manufactured by Dow Chemical Company; an alicyclic epoxy resin, CELLOXIDE 2021P manufactured by DAICEL CORPORATION and the like. One of these polyfunctional epoxy resins can be used or two or more of these in a combination.

A curing agent for curing the thermosetting resin is preferably included when the thermosetting resin composition of the present invention contains a thermosetting resin. As the curing agent, a known curing agent generally used for curing a thermosetting resin can be used, examples thereof including an imidazole latent curing agent such as amines, imidazoles, polyfunctional phenols, acid anhydrides, isocyanates, and imidazole adducts, and polymers containing these functional groups, and a plurality of these may be used if necessary. Amines include dicyandiamide, diaminodiphenylmethane, and the like. Imidazoles include alkyl-substituted imidazoles, benzimidazoles, and the like. Examples of the polyfunctional phenols include hydroquinone, resorcinol, bisphenol A and its halogen compounds, and further novolac and resole resins which are condensation products of aldehyde. Examples of acid anhydride include phthalic anhydride, hexahydrophthalic anhydride, methyl nadic anhydride, and benzophenone tetracarboxylic acid. As the isocyanates, tolylene diisocyanate, isophorone diisocyanate and the like may be used, and use may be made to those obtained by masking the isocyanate with phenols and the like. One of these curing agents may be used alone, or two or more may be used in combination.

Among the above-mentioned curing agents, amines and imidazoles can be suitably used from the viewpoint of adhesion to the conductive part and the insulating part, storage stability, and heat resistance. It is preferable that the main component is an adduct compound of an aliphatic polyamine such as alkylenediamine having 2 to 6 carbons, polyalkylene polyamine having 2 to 6 carbons, and aromatic ring-containing aliphatic polyamine having 8 to 15 carbons, or an adduct compound of an alicyclic polyamine such as isophorone diamine or 1,3-bis(aminomethyl) cyclohexane, or a mixture of an adduct compound of the aforementioned aliphatic polyamine and an adduct compound of the aforementioned alicyclic polyamine. In particular, a curing agent mainly composed of an adduct compound of xylylenediamine or isophorone diamine is preferred.

As the adduct compound of the above-described aliphatic polyamine, a compound obtained by adding aryl glycidyl ether (particularly, phenyl glycidyl ether or tolyl glycidyl ether) or alkyl glycidyl ether to the aliphatic polyamine is preferred. Further, as the adduct compound of the alicyclic polyamine, a compound obtained by adding n-butyl glycidyl ether, bisphenol A diglycidyl ether or the like to the alicyclic polyamine is preferable.

Examples of the aliphatic polyamine include alkylene diamine having 2 to 6 carbons such as ethylenediamine and propylenediamine, polyalkylene polyamine having 2 to 6 carbons such as diethylene triamine and triethylene triamine, and aromatic ring-containing aliphatic polyamine having 8 to 15 carbons such as xylylenediamine. Examples of commercially available modified aliphatic polyamines include FXE-1000 or FXR-1020, Fujicure FXR-1030, Fujicure FXR-1080, FXR-1090M2 (manufactured by Fuji Kasei Industry, Co., Ltd), ANCAMINE 2089K, SUNMIDE P-117, SUNMIDE X-4150, ANCAMINE 2422, Surwet R, SUNMIDE TX-3000, and SUNMIDE A-100 (manufactured by Air Products Japan K.K.).

As the cycloaliphatic polyamine, there can be illustrated isophorone diamine, 1,3-bis(aminomethyl)cyclohexane, bis (4-aminocyclohexyl)methane, norbornene diamine, 1,2-diaminocyclohexane, and laromin. Commercially available modified cycloaliphatic polyamines include, for example, ANCAMINE 1618, ANCAMINE 2074, ANCAMINE 2596, ANCAMINE 2199, SUNMIDE IM-544, SUNMIDE I-544, ANCAMINE 2075, ANCAMINE 2280, ANCAMINE 1934, ANCAMINE 2228 (manufactured by Air Products Japan K.K.), Daitocurar F-5197, Daitocurar B-1616 (manufactured by Daito Sangyo Co., Ltd.), Fujicure FXD-821, Fujicure 4233 (manufactured by Fuji Kasei Industry, Co., Ltd), and Laromin C-260 (manufactured by BASF Japan). Other polyamine type curing agents include EH-5015S (manufactured by ADEKA CORPORATION Co., Ltd.) and the like.

Examples of the imidazoles include a reaction product of an epoxy resin and imidazole. For example, mention can be made to 2-methylimidazole, 4-methyl-2-ethylimidazole, 2-phenylimidazole, 4-methyl-2-phenylimidazole, 1-benzyl-2-methylimidazole, 2-ethylimidazole, 2-isopropylimidazole, 1-cyanoethyl-2-methylimidazole, 1-cyanoethyl-2-ethyl-4-methylimidazole, 1-cyanoethyl-2-undecylimidazole and the like. Examples of the commercially available imidazoles include imidazoles of 2E4MZ, C11Z, C17Z, and 2PZ (all of which are reaction products of epoxy resins and imidazoles), 2MZ-A, 2E4MZ-A, and 2MZA-PW (all of which are AZINE (azine) compounds of imidazoles), 2MZ-OK and 2PZ-OK (both of which are isocyanurate salts of imidazoles), and 2PHZ and 2P4MHZ (both of which are imidazole hydroxymethyl) (these are all manufactured by SHIKOKU CHEMICALS CORPORATION). Examples of a commercially available product of the imidazole-type latent curing agent include Curezol P-0505 (manufactured by SHIKOKU CHEMICALS CORPORATION) and the like. The curing agent used in combination with imidazoles is preferably a modified aliphatic polyamine, a polyamine-type curing agent, or an imidazole-type latent curing agent.

Among the above-mentioned curing agents, at least two or more of the above-mentioned curing agents may be contained and one of them may be imidazoles in view that the storage stability of the thermosetting resin composition can be maintained. Further, in view of suppressing cracking and delamination, it is preferable to include at least one of either polyamine or indazole latent curing agent. When imidazoles are included, it is preferable to include two or more imidazoles.

In view of storage stability, viscosity ratio R, and easy adjustment of the pencil hardness measured by a pencil hardness test according to JIS-K5600-5-4:1999 in a heated state at 100° C. for 160 minutes to a more appropriate range, when a thermosetting resin is included, the blending amount of the curing agent is preferably 1 to 35 parts by mass and more preferably 4 to 30 parts by mass, with respect to 100 parts by mass of the thermosetting resin in terms of solid content. When imidazoles and another curing agent are used in combination, the blending ratio of the imidazoles and another curing agent is preferably 1:99 to 99:1 and more preferably 10:90 to 90:10 based on mass standard.

The thermosetting resin composition of the present invention is preferably used as a filling material for filling a penetrating hole such as a through hole or a recess part of a printed wiring board and preferably contains an inorganic filler for easing stress due to shrinkage by curing of the filling material and for adjusting the linear expansion coefficient. As the inorganic filler, use can be made to known inorganic fillers used in ordinary resin compositions. Specific examples include non-metallic fillers such as silica, barium sulfate, calcium carbonate, silicon nitride, aluminum nitride, boron nitride, alumina, magnesium oxide, aluminum hydroxide, magnesium hydroxide, titanium oxide, mica, talc, and organic bentonite, and metallic fillers such as copper, gold, silver, palladium, and silicone. One of these inorganic fillers may be used alone, or two or more may be used in a combination.

Among these inorganic fillers, calcium carbonate, silica, barium sulfate, and aluminum oxide, which are excellent in low moisture absorbency and low volume expansion are suitably used, and more preferably used among them are silica and calcium carbonate. Silica may be either amorphous or crystalline, or may be a mixture thereof. Especially preferred is amorphous (fused) silica. Calcium carbonate may be any of natural heavy calcium carbonate and synthetic precipitated calcium carbonate.

The shape of the inorganic filler is not particularly limited, and examples thereof include spherical-shaped, needle-shaped, plate-shaped, scale-shaped, hollow, irregularly shaped, hexagon-shaped, cubic-shaped, flake-shaped, and the like and preferred is spherical-shaped from the viewpoint of high formulation of the inorganic filler.

The average particle size of the inorganic filler is suitably in the range of 0.1 μm to 25 μm and preferably in the range of 0.1 μm to 15 μm, in consideration of dispersibility, filling properties in the hole part, smoothness when a wiring layer is formed on the filled portion, and the like of the inorganic filler. More preferred is 1 μm to 10 μm. Note that, the average particle diameter means an average primary particle diameter, and the average particle diameter (D50) can be measured by a laser diffraction/scattering method.

From the viewpoint of achieving both of the thermal expansion coefficient, polishing properties, adhesiveness when the inorganic filler was cured, and printing properties and filling properties, the blending ratio of the inorganic filler when a thermosetting resin is contained is preferably 10 to 1000 parts by mass, more preferably 20 to 500 parts by mass, and particularly more preferably 30 to 400 parts by mass with respect to 100 parts by mass of the thermosetting resin, in terms of solid content.

To the thermosetting resin composition of the present invention may be added, fillers treated with fatty acids for imparting thixotropy, or amorphous fillers such as organic bentonite or talc.

As the fatty acid, use can be made to a compound represented by general formula: $(R1COO)_n$—R2, wherein substituent R1 is a hydrocarbon having 5 or more carbons, substituent R2 is a hydrogen or a metal alkoxide or metal, and n is 1 to 4. When the number of carbons of the substituent R1 is 5 or more, the fatty acid can exhibit the effect of imparting thixotropy. More preferably, n is 7 or more.

The fatty acid may be an unsaturated fatty acid having a double or a triple bond in a carbon chain, or may be a saturated fatty acid free of the same. For example, stearic acid (carbon numbers, number of unsaturated bonds, and the value in parentheses are expressions of numerical values by the positions; 18:0), hexanoic acid (6:0), oleic acid (18:1 (9)), icosanoic acid (20:0), docosanoic acid (22:0), melisic acid (30:0), and the like. The number of carbons of the substituent R1 of these fatty acids is preferably 5 to 30. More preferably, the carbon number is 5 to 20. Further, for example, the fatty acid may have a skeleton having long fatty chains (those with carbon numbers of 5 or more) in the structure of coupling agent types, such as metal alkoxide in which the substituent R2 is a titanate-based substituent capped with an alkoxyl group. For example, trade name KR-TTS (manufactured by Ajinomoto Fine-Techno Co., Ltd.) can be used. In addition, metal soaps such as aluminum stearate and barium stearate (each manufactured by Kawamura Chemical Industry Co., Ltd.) can be used. Other elements of metal soaps include Ca, Zn, Li, Mg, and Na.

From the viewpoint of thixotropy, embedding properties, antifoaming properties, and the like, the appropriate blending ratio of the fatty acid is 0.1 to 2 parts by mass against 100 parts by mass of the inorganic filler.

The fatty acid may be blended by using an inorganic filler which has been surface treated with a fatty acid beforehand and can impart thixotropic properties to the thermosetting resin composition more effectively. In this case, the blending ratio of the fatty acid can be more reduced than in the case of using the untreated filler, and when all the inorganic filler is the fatty acid treated filler, the blending ratio of the fatty acid is preferably 0.1 to 1 part by mass with respect to 100 parts by mass of the inorganic filler.

The thermosetting resin composition of the present invention may contain a silane coupling agent. By blending a silane coupling agent, the adhesion between the inorganic filler and the epoxy resin is improved; whereby the cracks in the cured product can be suppressed from generating.

Examples of the silane coupling agent include epoxy silane, vinyl silane, imidazole silane, mercapto silane, methacryloxy silane, amino silane, styryl silane, isocyanate silane, sulfide silane, ureido silane, and the like. Further, the silane coupling agent may be blended by using an inorganic filler that has been surface treated with a silane coupling agent beforehand.

The blending ratio of the silane coupling agent is preferably 0.05 to 2.5 parts by mass with respect to 100 parts by mass of the inorganic filler from the viewpoint of achieving both adhesion between the inorganic filler and the epoxy resin and antifoaming properties.

The thermosetting resin composition of the present invention may be blended with an oxazine compound having an oxazine ring, which is obtained by reacting a phenol compound, formalin, and a primary amine, if necessary. By comprising an oxazine compound, when the thermosetting resin composition filled in the hole part of the printed wiring board was cured, followed by electroless plating on the formed cured product, it is possible to easily roughen the cured product by an aqueous solution of potassium permanganate or the like, thereby improving the peel strength against the plating.

It is also possible to add known colorants such as phthalocyanine blue, phthalocyanine green, disazo yellow, titanium oxide, carbon black, and naphthalene black used in ordinary resist inks for screen printing.

In order to provide storage stability during storage, a known thermal polymerization inhibitor such as hydroquinone, hydroquinone monomethyl ether, tert-butylcatechol, pyrogallol, phenothiazine, or a known thickener such as clay, kaolin, organic bentonite, or montmorillonite to adjust the viscosity, or a thixotropic agent may be added. In addition, well-known additives such as defoamers of silicone type, fluorine type, and polymer type, and adhesion imparting agents such as leveling agents, imidazole type, thiazole type, triazole type, and silane coupling agents can be blended. In particular, the case when organic bentonite is used is preferred since the portion protruding from the surface of the hole part tends to be formed in a protruding state which is easy to polish and remove, resulting in excellent polishing properties. In addition, well-known conventional colorants may be blended such as phthalocyanine blue, phthalocyanine green, iodine green, disazo yellow, crystal violet, titanium oxide, carbon black, and naphthalene black.

The above-described thermosetting resin composition is particularly suitably used for forming a cured film in a printed wiring board, and can be used as a filling material for filling a penetrating hole of a through hole or a via hole or a hole part of a recess part of a solder resist, an interlayer insulating material, a marking ink, a cover lay, a solder dam, or a printed wiring board. Among these, it can be suitably used as a filling material for filling a penetrating hole of a through hole or a via hole, and a hole part of a recess part of a printed wiring board. According to the present invention, it is possible to realize a thermosetting resin composition which suppress liquid dripping and bleeding even when used for filling a printed wiring board having a hole part with a large diameter, and in particular, which can suppress the generation of cracks even when used for filling holes in a printed wiring board having, and even when used for filling holes in a multilayer printed wiring board having a conductive part and an insulating part on the inner wall of the hole part such as a through hole. The thermosetting resin composition according to the present invention may be one-part liquid or two-part or more.

The cured product according to the present invention is obtained by curing the above thermosetting resin composition.

<Use of Cured Product>

Next, a method of filling a hole part and the like by applying the thermosetting resin composition of the present invention to a general printed wiring board will be described with reference to the drawings. FIG. 1 is a schematic diagram illustrating a step of filling a penetrating hole (through hole) in a printed wiring board using a thermosetting resin composition. First, a printed wiring board 1 having a penetrating hole 4 having an plated inner wall surface is prepared (FIG. 1a). In the printed wiring board 1 shown in FIG. 1a, a penetrating hole is formed by a drill or the like on the surface of an insulating layer 6 having a wiring layer 5 provided on the surface, and at least one of 1 electroless plating and electrolytic plating is applied to the inner wall of the penetrating hole 4 and the surface of the wiring layer 5. Note that, although FIG. 1a shows the printed wiring board 1 in which the wiring layer 5 is provided on the surface of the insulating layer 5, the present invention is not limited thereby, and use can be made to a printed wiring board in which the wiring layer 5 is not provided on the surface of the insulating layer 6. In such a case, a penetrating hole is formed on the surface of the insulating layer 6 by a drill or the like, and at least one of electroless plating and electrolytic plating is applied to the inner wall and the surface of the penetrating hole 4 to form a conductive part on the inner wall and the surface.

Figure 1B:
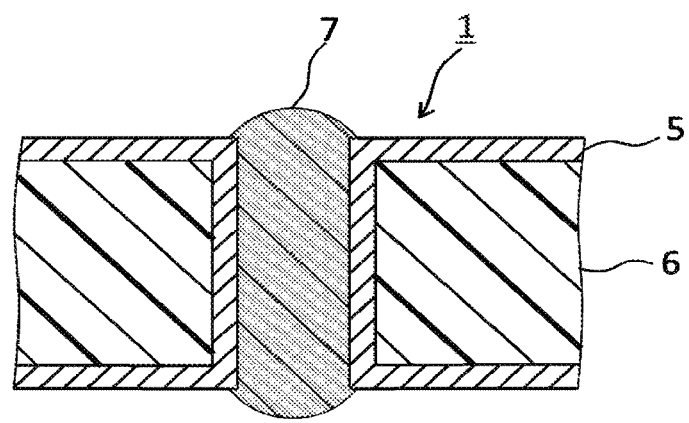
FIG. 1b is a schematic diagram illustrating a step of filling a penetrating hole in a printed wiring board using a thermosetting resin filling material.

Next, the penetrating hole 4 is filled with a thermosetting resin composition. Examples of the filling method include a method in which a mask having an opening in the penetrating hole part is placed on a printed wiring board and the thermosetting resin composition is applied through the mask by a printing method or the like, or a method in which the penetrating hole is filled with the thermosetting resin composition by a dot printing method or the like. Thereafter, the printed wiring board 1 is heated to cure the filled thermosetting resin composition (FIG. 1b).

Figure 1C:
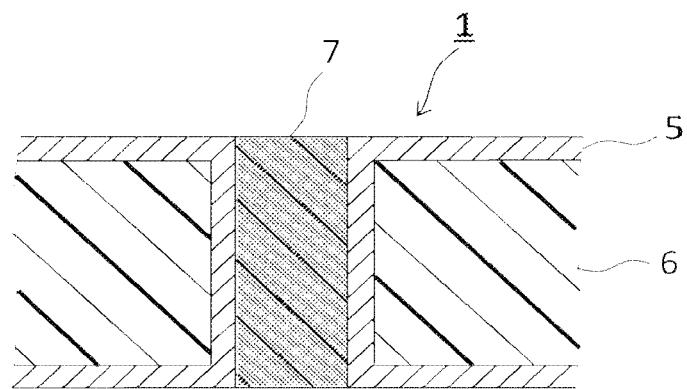
FIG. 1c is a schematic diagram illustrating a step of filling a penetrating hole in a printed wiring board using a thermosetting resin filling material.

Subsequently, the unnecessary portion of the cured product 7 protruding from the surface of the penetrating hole is removed by polishing to be flattened (FIG. 1c). The polishing can be suitably performed by a belt sander, buffing or the like.

Figure 1D:
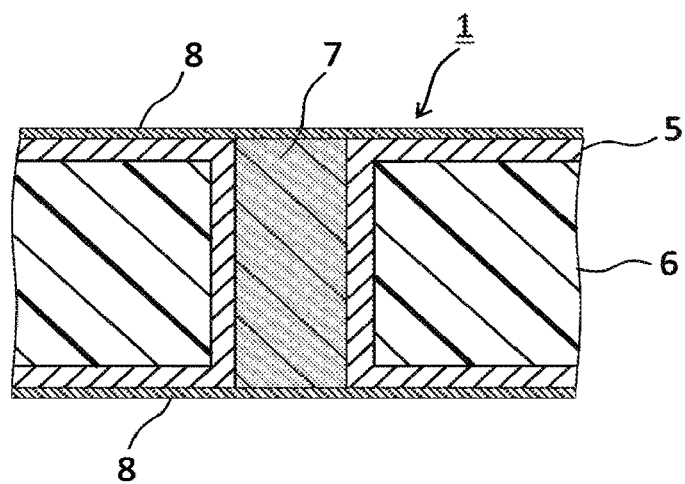
FIG. 1d is a schematic diagram illustrating a step of filling a penetrating hole in a printed wiring board using a thermosetting resin filling material.

Next, after pretreating the surface of the printed wiring board 1 by buffing or roughening treatment as required, outer insulating layer 8 is formed (FIG. 1d). Since the surface of the wiring layer 5 will be formed in to a roughened surface having an excellent anchoring effect by this pretreatment, the adhesion with the outer insulating layer 8 becomes excellent. The outer insulating layer 8 is a solder resist layer (not shown), an insulating resin layer (not shown), a protective mask (not shown), or the like, depending on the subsequent treatment, and can be formed by applying various known thermosetting resin compositions, or thermosetting resin compositions such as a photo-curable and thermosetting resin compositions, or by laminating a dry film or a prepreg sheet. In the case of forming a fine pattern on the outer insulating layer 8, it is preferable to use a photo-curable or thermosetting resin composition or a dry film thereof.

Thereafter, the printed wiring board 1 is further heated to be fully cured (finish cured) to form the outer insulating layer 8, if necessary. Note that, when a photo-curable, thermosetting resin composition is used for the formation of the outer insulating layer 8, full curing is done after drying (temporary curing) and exposing to light according to a known method. Note that, when a double-sided substrate as shown in FIG. 1(a) is used as the printed wiring board 1, a multilayer printed wiring board can be formed by repeating the formation of the wiring layer 5 and the formation of the insulating layer 6 alternately and, if necessary, forming a penetrating hole 3 by a well-known method.

Figure 2:
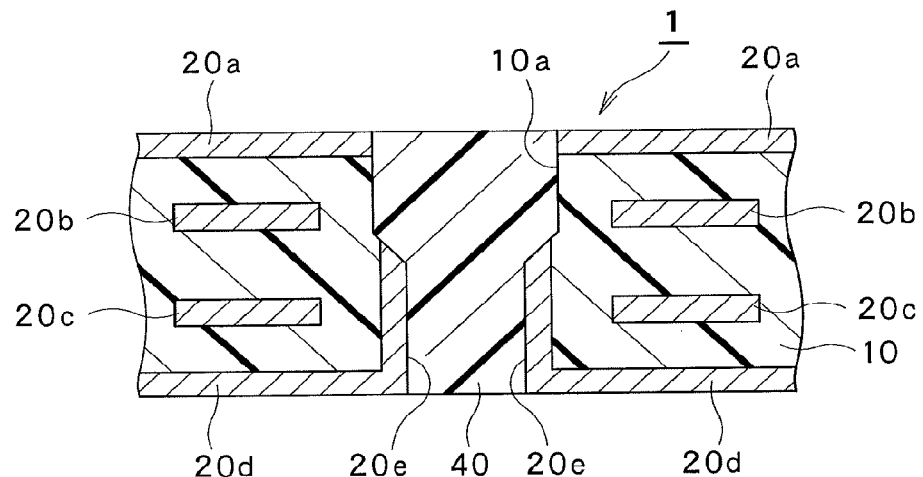
FIG. 2 is a schematic cross-sectional view showing one embodiment of a printed wiring board filled with a thermosetting resin composition.

FIG. 2 is a schematic cross-sectional view showing an embodiment of a multilayer printed wiring board filled with a thermosetting resin composition. A multilayer printed wiring board 1 to which a thermosetting resin composition is applied is provided with a plurality of wiring layers 20a, 20b, 20c, 20d, composed of a plated film or the like which are laminated in the thickness direction via an insulating layer 10, and also with a penetrating hole 40 (a hole part to be filled with the thermosetting resin composition) formed in the thickness direction of the wiring layers 20a, 20b, 20c, 20d. A conductive part 20e extending from the wiring layer 20d is formed on the inner wall of the penetrating hole 40 at one end of the hole part of the penetrating hole 40. At the other end of the hole part of the penetrating hole 40, the inner diameter of the penetrating hole is enlarged so as to remove a part of the wiring layer 20a after the formation of the conductive part 20e, and the insulating layer is exposed at the inner wall of the hole part to result in the state where an insulating part 10a is formed. That is, the inner wall of the penetrating hole 40 (hole part) is in a state where the conductive part 20e and the insulating part 10a are provided. By providing the conductive part 20e and the insulating part 10a on the inner wall of the penetrating hole 40 (hole part) in this manner, a portion which is electrically disconnected is formed, which as a result, improves the transmission efficiency. The penetrating hole 40 (hole part) having such a cross-sectional shape is filled with the thermosetting resin composition and cured by heating to fill the hole. Note that, in the present embodiment, the insulating layer means a layer that supports the wiring layer while insulating between the different wiring layers, and the wiring layer means a layer that conducts electricity by a circuit. The insulating part means a part where each layer is not electrically conducted, and may include the insulating layer described above. On the other hand, the conductive part refers to a part for electrically conducting each wiring layer, such as a plating film, and may include the aforementioned wiring layer. Further, the penetrating hole is a hole provided so as to perforate the entire thickness direction of the multilayer printed wiring board. The penetrating hole may be formed in the thickness direction of the wiring layer, more specifically, as long as it is not formed in parallel to the wiring layer. Note that, in the present embodiment, the wiring layer extending to the wall surface of the penetrating hole is used as the conductive part; however, a part of the wiring layer is also referred to as the conductive part when it is exposed to the wall surface of the penetrating hole. In addition to the case where the above-mentioned wiring layer is formed by extending to the wall surface, the case where the conductive film is formed on the wall surface by plating or the like is also referred to as a conductive part.

Figure 3:
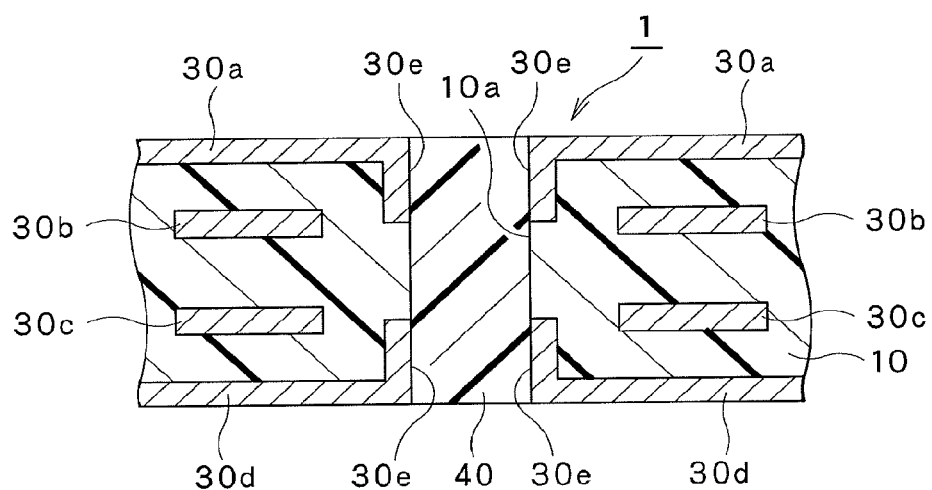
FIG. 3 is a schematic cross-sectional view showing another embodiment of a printed wiring board filled with a thermosetting resin composition.

In another embodiment of the present invention, the shape of the hole part of the penetrating hole may be, apart from the description above, for example a multilayer printed wiring board as shown in FIG. 3, in which the wiring layers 30a and 30d extend to the inner wall of the penetrating hole 40 (hole part) to form the conductive part 30e, and a part of the conductive part is removed and the insulating layer is exposed so as to result in the state where the conductive part 30e and the insulating part 10a are provided. Note that, in the present embodiment, the wiring layer extending to the wall surface of the penetrating hole is referred to as the conductive part; however, a part of the wiring layer is also referred to as the conductive part when it is exposed to the wall surface of the penetrating hole. In addition to the case where the wiring layer is formed by extending to the wall surface, the case where a conductive film is formed on the wall surface by plating and the like is also referred to as a conductive part.

Figure 4:
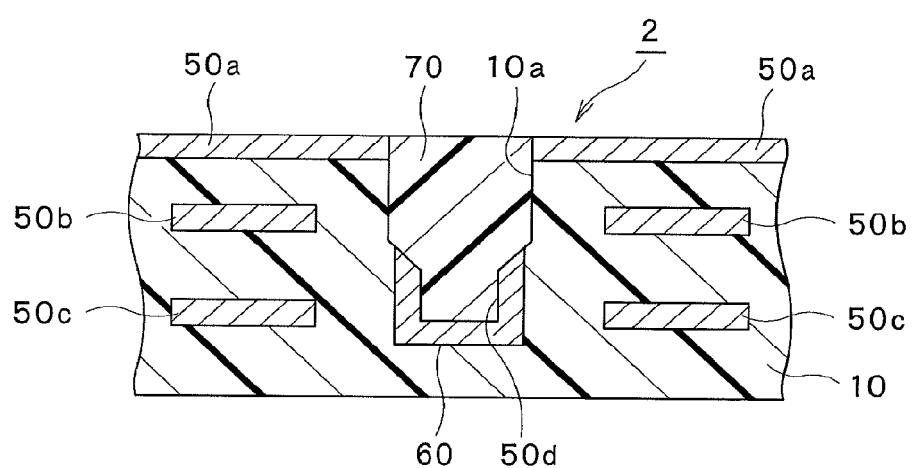
FIG. 4 is a schematic cross-sectional view showing another embodiment of a printed wiring board filled with a thermosetting resin composition.

Further, in another embodiment of the present invention, filling using the thermosetting resin composition is not limited to the penetrating hole, but may be performed on, for example, a multilayer printed wiring board 2 having a recess part 70 as shown in FIG. 4. In a multilayer printed wiring board 2, a wiring layer 50a provided on one surface of an insulating layer 10 extends to the wall surface and bottom part 60 of the recess part 70 to form a conductive part 50d, the inner diameter of the recess part is enlarged on the opening side of the recess part 70 so as to remove a part of the wiring layer 50a after the conductive section 50d is formed, and the insulating layer is exposed on the inner wall of the hole part to result in the state where insulating part 10a is formed. That is, the inner wall of the recess part (hole part) having a bottom part is in a state where the conductive part 50d and the insulating part 10a are provided. Note that, in the present embodiment, the wiring layer extending to the wall surface of the recess part is referred to as the conductive part; however, a part of the wiring layer is also referred to as the conductive part when it is exposed to the wall surface of the recess part. In such a multilayer printed wiring board 2, when the recess part 70 having the bottom part 60 is filled with the thermosetting resin composition, the thermosetting resin composition comes into contact with both the conductive part extending from the wiring layer 50a and the insulating part exposed on the wall surface of the recess part 70. In addition to the case where the above-mentioned wiring layer is formed by extending to the wall surface, the case where a conductive film is formed on the wall surface by plating and the like is also referred to as a conductive part. In the present embodiment, the recess part refers to a portion of the surface of the multilayer printed wiring board that is identified to be clearly more recessed than the other portions.

In the multilayer printed wiring board, the range of the inner diameter and the depth of the recess part having a penetrating hole or the bottom part is preferably 0.1 to 1 mm and 0.1 to 10 mm, respectively.

The wiring layer forming the conductive part is copper plating, gold plating, tin plating, and the like without particular limitation, and preferably made of copper from the viewpoint of filling properties of the thermosetting resin composition and adhesion to the cured product. Similarly, examples of the insulating layer constituting the printed wiring board include paper phenol, paper epoxy, glass cloth epoxy, glass polyimide, glass cloth/non-woven epoxy, glass cloth/paper epoxy, synthetic fiber epoxy, fluorine-based resin, polyphenylene ether, polyphenylene oxide, cyanate ester, polyimide, PET, glass, ceramic, silicon wafer, and the like. Among these, from the viewpoint of filling properties of the thermosetting resin composition and adhesiveness to the cured product, the thermosetting resin composition is preferably made of glass cloth/non-woven epoxy, polyphenylene ether, polyimide, or ceramic, and more preferably an epoxy resin-containing cured product. The epoxy resin-containing cured product means a cured product of an epoxy resin impregnated with glass fibers or a cured product of a resin composition containing an epoxy resin.

When a thermosetting resin composition is used as a filling material, the filling material is filled in, for example, a recess part having a hole part or a bottom part of a penetrating hole of the multilayer printed wiring board of the above-described embodiment by using a known patterning method such as a screen printing method, a roll coating method, a die coating method, or a vacuum printing method. At this time, the filling material is completely filled so as to slightly protrude from the hole part or the recess part. A multilayer printed wiring board in which a hole part and a recess part are filled with a thermosetting resin composition is heated at, for example, 80 to 160° C. for about 30 to 180 minutes, whereby the thermosetting resin composition is cured to form a cured product. In particular, it is preferable to cure in 2 stages from the viewpoint of suppressing generation of the outgas. That is, it is preferable that the thermosetting resin composition is pre-cured at a lower temperature, and then fully cured (finish-cured). The conditions for pre-curing are preferably heating at 80 to 110° C. for about 30 to 180 minutes. Since the pre-cured product is relatively low in hardness, unnecessary parts protruding from the surface of the substrate can be easily removed by physical polishing to form a flat surface. Then, it is fully cured by heating. The conditions for the full-curing are preferably heating at 130 to 160° C. for about 30 to 180 minutes. At this time, because of low expansion properties, the cured product hardly expands or contracts and becomes a final cured product having good dimensional stability and low hygroscopicity, and excellent adhesion and electrical insulation properties and the like. Note that, the hardness of the pre-cured product can be controlled by changing the heating time of the pre-curing and the heating temperature.

After the thermosetting resin composition is cured as described above, an unnecessary part of the cured product protruding from the surface of the printed wiring board is removed by a known physical polishing method and planarized, and subsequently the wiring layer on the surface is patterned into a predetermined pattern to form a predetermined circuit pattern. If necessary, the surface of the cured product may be roughened by an aqueous solution of potassium permanganate and the like, and then a wiring layer may be formed on the cured product by electroless plating and the like.

Examples

Next, the present invention will be described in more details with reference to the Examples; however, the present invention is not limited to these examples. Unless otherwise specified, "parts" and "%" are all based on mass in the following description.

<Preparation of Thermosetting Resin Composition>

Various components shown in the following Tables 1 and 2 were blended at the ratios (parts by mass) shown in the respective tables, pre-mixed with a stirrer, and subsequently dispersed with a 3-roll mill to prepare each thermosetting resin composition of Examples 1 to 12 and Comparative Examples 1 to 5.

Note that, *1 to *18 in Tables 1 and 2 represent the following components.
1: EPDX MK R710 (bisphenol E type epoxy resin) manufactured by Printec Co., Ltd.
*2: jER828 (bisphenol A type liquid epoxy resin) manufactured by Mitsubishi Chemical Corporation
*3: jER807 (bisphenol F type liquid epoxy resin) manufactured by Mitsubishi Chemical Corporation
*4: EP-3300E (hydroxybenzophenone type liquid epoxy resin) manufactured by ADEKA CORPORATION
*5: Celloxide 2021P (cycloaliphatic epoxy resin) manufactured by DAICEL CORPORATION
*6: jER630 (triglycidyl aminophenol) manufactured by Mitsubishi Chemical Corporation
*7: jER604 (glycidyl amine-type epoxy resin) manufactured by Mitsubishi Chemical Corporation
*8: 2PHZ (imidazole hydroxylmethyl) manufactured by SHIKOKU CHEMICALS CORPORATION
*9: Fujicure FXR-1030 (modified aliphatic polyamine) manufactured by Fuji Kasei Industries, Ltd.
*10: 2MZA-PW (imidazole curing agent) manufactured by SHIKOKU CHEMICALS CORPORATION
*11: EH-5015S (polyamine type curing agent) manufactured by ADEKA CORPORATION
*12: SHIKOKU CHEMICALS CORPORATION Curezol P-0505 (imidazole type latent curing agent)
*13: DICY (dicyandiamide) manufactured by Mitsubishi Chemical Corporation
*14: 2E4MHZ (imidazole hydroxymethyl) manufactured by SHIKOKU CHEMICALS CORPORATION
*15: Maruo Calcium Co., Ltd. Super 4S (heavy calcium carbonate)
*16: SO—C6 (amorphous silica) manufactured by Admatex Co., Ltd.
*17: Orben M (cationized bentonite) manufactured by Shiraishi Kogyo Co., Ltd.
*18: Shin-Etsu Chemical Co., Ltd. KS-66 (silicone antifoaming agent)

<Viscosity Measurement of Thermosetting Resin Composition>

The viscosity $V_1$ of each of the obtained thermosetting resin compositions was measured using a cone-flat plate type rotational viscometer (cone-plate type) (manufactured by Toki-Sangyo Co., Ltd., TV-30 type, rotor 3°×R9.7) under the conditions of 25° C. and 30 seconds value of 5 rpm.

For each of the thermosetting resin compositions, 0.2 ml of the sample was metered with a syringe using a parallel-plate oscillatory rheometer (HAAKE RheoStress6000 manufactured by ThermoFisher Co., Ltd.), placed it on an aluminum disk having a diameter of 20 mm set at 30° C., set to a test piece thickness of 0.5 mm, preheated at 30° C. for 180 seconds, and then measured the temporal change of the melt viscosity at each temperature at measuring points of strain control system at a temperature elevation rate of 5° C./min, a measurement temperature of 30 to 150° C., frequency of 1 Hz, shear strain of 0.1740. The minimum value of the melt viscosity at 60° C. to 100° C. is expressed as $V_2$. From the measured values of $V_1$ and $V_2$, the viscosity ratio R expressed by $V_2/V_1$ was calculated. The viscosity ratios R of the respective thermosetting resin compositions are shown in Tables 1 and 2.

<Pencil Hardness>

Each of the thermosetting resin compositions were applied to a copper solid substrate having a copper thickness of 35 µm, which was washed with water after buffing roll polishing and dried on the entire surface by a screen printing method using a 100 mesh screen plate so that the thickness of the dried coating film was 20 to 40 µm, and heated in a hot-air circulation drying oven (DF610 manufactured by Yamato Science Co., Ltd.) at 100° C. for 160 minutes. The pencil hardness of the surface of the coating film after heating was measured in accordance with JIS-K5600-5-4: 1999, and the pencil hardness was defined as the highest pencil hardness without any damage to the coating film. The test was conducted twice and if the results of the 2 tests differed by more than one unit, the test was abandoned and redone. The pencil hardness of the coating film using each of the thermosetting resin compositions was as shown in Tables 1 and 2.

<Gel Time Measurement>

The gel time was measured using a hot-plate type gelation tester (GT-D, manufactured by Yuukari Giken K.K.) in accordance with the hot plate method specified in JIS-C2161:2010. A sample obtained by weighing out 0.5 mL of each thermosetting resin composition with a syringe was placed on a hot plate of a gelation testing machine set at 110° C., and while the stirring needle was maintained at an angle of 90 degrees with respect to the surface of the hot plate, the sample was stirred into a circular shape at a speed of 90±10 times/min with the tip of the needle, and the time from the placement of the sample to the end point was measured, in which the end point was determined as the time when the sample became in a gel state such as when the stirring needle was unable to be rotated or when the sample became unattached to the tip of the needle. This operation was repeated 3 times, and the average time was defined as the gel time. The gel times of the respective thermosetting resin compositions were as shown in Tables 1 and 2.

<Evaluation of Filling Properties after Curing>

A multilayer printed wiring board was prepared having a through hole to which a conductive part and an insulating part are formed in the inner wall by conducting drill process (drill diameter 0.5 mm) from one side to the depth of 1.6 mm of a 3.2 mm-thick multilayer printed wiring board (FR-4 material, model number MCL-E67, manufactured by Hitachi Chemical Company, Ltd.) having a through hole formed by providing a copper-plated wiring layer (plated thickness: 25 μm) on the entire inner wall surface of a penetrating hole having an inner diameter of 0.3 mm and a depth of 3.2 mm and removing a part of the wiring layer to expose the insulating layer.

Each thermosetting resin composition was filled into a through hole of a multilayer printed wiring board by a screen printing method, and the wiring board was placed upright against a rack into a state where it was mounted at an angle of 90°±10° with respect to the mounting surface, then the wiring board was heated at 110° C. for 30 minutes in a hot-air circulation type drying furnace (DF610 manufactured by Yamato Science Co., Ltd.) to cure the thermosetting resin composition.

The surface of the substrate after curing was observed with an optical microscope, and filling properties of the hole parts filled with the thermosetting resin composition were evaluated according to the following evaluation standards.
- ○: The state at the time of filling the thermosetting resin composition (convex state) is maintained on the surface of the through hole on the drilled side.
- Δ: A slight recess part was generated on the surface of the through hole on the drilled side.
- X: A large recess part was generated on the surface of the through hole on the drilled side.

The evaluation results are shown in Tables 1 and 2 below.

<Presence/Absence of Bleeding>

As described in the above <Evaluation of Filling Properties after Curing>, the thermosetting resin compositions were filled and the surface of the wiring boards was visually observed to confirm the presence/absence of bleeding (a state in which the resin is flowing out of the substrate surface).
- ○: No bleeding generated
- x: Bleeding generated The evaluation results are shown in Tables 1 and 2 below.

<Generation of Cracks and Delamination>

Using the wiring boards evaluated in the above <Evaluation of Filling Properties after Curing>, the cross section of the filled through holes was observed by an optical microscope and an electron microscope, and the presence/absence of cracks and delamination (peeling) was confirmed. After the reflow treatment (maximum temperature: 260° C., 5 cycles) of the filled wiring boards, the presence/absence of cracks and delamination in the cross section of the through holes was confirmed in the same manner as described above.

Note that, in the microscopic observation, the cross section of the through holes to be observed was formed as follows. That is, the multilayer printed wiring board including the through holes was cut vertically in the thickness direction, and the cross section of the through holes was polished using an SiC abrasive paper (Nos. 500 and 2000, manufactured by Marumoto Struers K.K.) and a polishing machine (FORCIPOL-2V, manufactured by Herzog Co., Ltd.).
- ⊚: The total number of places generated with cracks or delamination is 0 to 2.
- ○: The total number of places generated with cracks or delamination is 3 to 5.
- Δ: The total number of places generated with cracks or delamination is 6 to 20.
- X: The total number of places generated with cracks or delamination is 21 or more.

The evaluation results are shown in Tables 1 and 2 below.

<Evaluation of Storage Stability>

Each of the prepared thermosetting resin compositions of Examples 1 to 12 were stored at 25° C. for 5 days, and then the viscosity ($V_1'$) of each of the thermosetting resin compositions was measured in the same manner as the above-described measurement of the viscosity $V_1$. The viscosity increasing rate ($\Delta \eta$) was calculated by the following equation.

$$\Delta \eta = V_1'/V_1 \times 100$$

The storage stability was evaluated according to the following evaluation standards.
- ⊚: $\Delta \eta < 10\%$
- ○: $\Delta \eta = 10\%\text{-}100\%$
- Δ: $\Delta \eta > 100\%$ The evaluation results are shown in Tables 1 and 2 below.

TABLE 1

| Composition (parts by mass) | | Examples | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| Epoxy Resin | EPOX MK R710[*1] | — | 40 | 60 | — | — | 10 | — | — | — | — | — | 30 |
| | jER828[*2] | 15 | 60 | — | 30 | 40 | 70 | 15 | 15 | 40 | 15 | 15 | 20 |
| | jER807[*3] | 30 | — | 40 | 70 | 40 | — | 30 | 30 | 40 | 30 | 30 | 30 |
| | EP-3300E[*4] | — | — | — | — | — | — | — | — | 20 | — | — | — |
| | Celloxide 2021P[*5] | — | — | — | — | — | — | — | — | — | — | — | — |
| | jER630[*6] | 55 | — | — | — | — | 20 | 55 | 55 | — | 55 | 55 | 20 |
| | jER604[*7] | — | — | — | — | 20 | — | — | — | — | — | — | — |
| Curing Agent | 2PHZ[*8] | 6 | 6 | — | — | — | — | 6 | — | 6 | — | — | — |
| | FXR-1030[*9] | 6 | 6 | — | — | — | — | 6 | — | 6 | — | — | — |
| | 2MZA-PW[*10] | — | — | 6 | 6 | 6 | 6 | — | — | — | 6 | — | 6 |
| | EH-5015S[*11] | — | — | 6 | — | — | — | — | 15 | — | 20 | — | — |
| | P0505[*12] | — | — | — | 6 | 6 | 6 | — | — | — | — | 30 | — |
| | DICY[*13] | — | — | — | — | — | — | — | — | — | — | — | — |
| | 2E4MZ[*14] | — | — | — | — | — | — | — | — | — | — | — | 3 |

TABLE 1-continued

| | Composition (parts by mass) | 1 | 2 | 3 | 4 | 5 | 6 | 7 | 8 | 9 | 10 | 11 | 12 |
|---|---|---|---|---|---|---|---|---|---|---|---|---|---|
| Inorganic filler | Super 4S*15 | 80 | 80 | 80 | 80 | 80 | 80 | 120 | 120 | 80 | 120 | 120 | 120 |
| | SO-C6*16 | 40 | 40 | 40 | 40 | 40 | 40 | — | — | 40 | — | — | — |
| Additive | Orben M*17 | — | — | — | — | — | — | — | — | — | — | — | — |
| | KS-66*18 | 3 | 3 | 3 | 3 | 3 | 3 | 3 | 3 | 3 | 3 | 3 | 3 |
| Viscosity | $V_1$(dPa·s) | 420 | 570 | 360 | 480 | 530 | 630 | 470 | 490 | 670 | 520 | 590 | 530 |
| | $V_2$(dPa·s) | 90 | 40 | 290 | 1050 | 5190 | 4030 | 110 | 8910 | 80 | 21800 | 48200 | 12200 |
| | Viscosity ratio R ($V_2/V_1$) | $2.1 \times 10^{-1}$ | $7.0 \times 10^{-2}$ | $8.1 \times 10^{-1}$ | $2.2 \times 10^{0}$ | $9.8 \times 10^{0}$ | $6.4 \times 10^{0}$ | $2.3 \times 10^{-1}$ | $1.8 \times 10^{1}$ | $1.2 \times 10^{-1}$ | $4.2 \times 10^{1}$ | $8.2 \times 10^{1}$ | $2.3 \times 10^{1}$ |
| | Pencil Hardness | 2H | HB | 4H | 6H | 6H | 6H | 2H | 6H | 2H | 6H | 6H | 6H |
| | Gel time | 17 min 20 sec | 25 min 35 sec | 13 min 40 sec | 7 min 40 sec | 6 min 15 sec | 6 min 35 sec | 17 min 00 sec | 3 min 55 sec | 19 min 10 sec | 3 min 10 sec | 2 min 20 sec | 5 min 10 sec |
| | Filling properties after curing | ○ | ○ | ○ | ○ | ○ | ○ | ○ | ○ | ○ | ○ | ○ | ○ |
| | Presence/absence of bleeding after curing | ○ | ○ | ○ | ○ | ○ | ○ | ○ | ○ | ○ | ○ | ○ | ○ |
| Presence/absence of generation of cracks and delamination | After curing | ○ | Δ | ◎ | ◎ | ◎ | ◎ | ○ | ◎ | ○ | ○ | ○ | ◎ |
| | After reflow treatment | ○ | Δ | ◎ | ◎ | ◎ | ◎ | ○ | ◎ | ○ | ○ | ○ | ◎ |
| | Storage stability | ○ | ◎ | ○ | ○ | ○ | ○ | ○ | ○ | ○ | ○ | Δ | ○ |

TABLE 2

| | Composition (parts by mass) | 1 | 2 | 3 | 4 | 5 |
|---|---|---|---|---|---|---|
| Epoxy Resin | EPOX MK R710*1 | — | — | — | — | — |
| | jER828*2 | 100 | 40 | 50 | 50 | 60 |
| | jER807*3 | — | 40 | 50 | 50 | — |
| | EP-3300E*4 | — | — | — | — | — |
| | Celloxide 2021P*5 | — | — | — | — | 40 |
| | jER630*6 | — | 20 | — | — | — |
| | jER604*7 | — | — | — | — | — |
| Curing Agent | 2PHZ*8 | — | — | — | — | 6 |
| | FXR-1030*9 | — | — | — | 2 | 6 |
| | 2MZA-PW*10 | 6 | 8 | — | — | — |
| | EH-5015S*11 | — | — | — | — | — |
| | P0505*12 | — | — | — | — | — |
| | DICY*13 | — | — | — | 7 | — |
| | 2E4MZ*14 | — | — | 5 | — | — |
| Inorganic filler | Super 4S*15 | — | 145 | 40 | 120 | 120 |
| | SO-C6*16 | 165 | — | 120 | — | — |
| Additive | Orben M*17 | 4 | — | — | — | — |
| | KS-66*18 | 3 | 1 | 1 | 3 | 3 |
| Viscosity | $V_1$(dPa·s) | 800 | 500 | 600 | 470 | 450 |
| | $V_2$(dPa·s) | 10 | 15 | 70200 | 0.6 | 210 |
| | Viscosity Ratio R ($V_2/V_1$) | $1.3 \times 10^{-2}$ | $3.0 \times 10^{-2}$ | $1.2 \times 10^{2}$ | $1.3 \times 10^{-3}$ | $4.7 \times 10^{-1}$ |
| | Pencil Hardness | B or less | B or less | 6H | B or less | B or less |
| | Geltime | 30 min or longer | 30 min or longer | 1 min 50 sec | 30 min or longer | 30 min or longer |
| | Filling properties after curing | Δ | Δ | ○ | X | ○ |
| | Presence/absence of bleeding after curing | X | X | ○ | X | X |
| Presence/absence of generation of cracks and delamination | After curing | X | Δ | X | X | X |
| | After reflow treatment | X | Δ | X | X | X |
| | Storage stability | —* | —* | —* | —* | —* |

As is clear from the evaluation results in Tables 1 and 2, it is understood that the filling properties (liquid dripping) and bleeding after curing are improved and the generation of cracks and delamination are suppressed in the thermosetting resin compositions (Examples 1 to 11) having a viscosity ratio R in the range of $5.0 \times 10^{-2}$ to $1.0 \times 10^{2}$ and a pencil hardness of HB or more, as compared with the thermosetting resin compositions (Comparative Examples 1, 2, and 4) having the viscosity ratio R expressed by $V_2/V_1$ out of the range of $5.0 \times 10^{-2}$ to $1.0 \times 10^2$ and a pencil hardness of B or less. In addition, it can be seen that, the filling properties and bleeding after curing are improved; however the generation of cracks and delamination cannot be fully suppressed for the thermosetting resin composition in which the viscosity ratio R expressed by $V_2/V_1$ is outside the range of $5.0 \times 10^{-2}$ to $1.0 \times 10^2$ even if the pencil hardness is HB or more (Comparative Example 3), or the thermosetting resin composition in which the pencil hardness is B or less even if the viscosity ratio R expressed by $V_2/V_1$ is within the range of $5.0 \times 10^{-2}$ to $1.0 \times 10^2$ (Comparative Example 5).

DESCRIPTION OF THE REFERENCE NUMERAL

1 Printed wiring board
2 Multilayer printed wiring board having a penetrating hole
3 Multilayer printed wiring board having a recess part
4 Penetrating hole plated on the inner wall surface
5 Wiring layer
6 Insulating layer
7 Pre-cured material
8 Outer insulating layer
10 Insulating layer
10a Insulating part
20a, 20b, 20c, 20d Wiring layers
30a, 30b, 30c, 30d Wiring layers
40 Penetrating hole
50a, 50b, 50c Wiring layers
20e, 30e, 50d Conductive parts
60 Bottom part
70 Recess part

The invention claimed is:

1. A thermosetting resin composition, comprising:
a thermosetting resin comprising an epoxy resin,
wherein the thermosetting resin composition has a viscosity ratio R of formula V2/V1 in a range of $5.0 \times 10^{-2}$ to $1.0 \times 10^2$, where V1 is a viscosity measured in dPa·s by a cone-flat plate type rotational viscometer in accordance with JIS-Z 8803:2011 and V2 is the minimum value of a melt viscosity measured in dPa·s at 60° C. to 100° C. by a parallel-plate oscillatory rheometer in accordance with JIS-K7244-10:2005, and a pencil hardness of HB or more measured by a pencil hardness test according to JIS-K5600-5-4:1999 in a state of a cured product which is obtained by a process comprising heating the thermosetting resin composition at 100° C. for 160 minutes.

2. The thermosetting resin composition according to claim 1, wherein the thermosetting resin composition has a gel time of within 30 minutes at 110° C. measured in accordance with the hot plate method specified in JIS-C2161:2010.

3. The thermosetting resin composition according to claim 2, further comprising:
a curing agent; and
an inorganic filler.

4. A filling material for a penetrating hole or a recess part in a printed wiring board, comprising:
the thermosetting resin composition of claim 3.

5. A cured product obtained by curing the filling material of claim 4.

6. A printed wiring board, comprising:
the cured product of claim 5.

7. A cured product obtained by curing the thermosetting resin composition of claim 3.

8. A printed wiring board, comprising:
the cured product of claim 3.

9. A filling material for a penetrating hole or a recess part in a printed wiring board, comprising:
the thermosetting resin composition of claim 2.

10. A cured product obtained by curing the thermosetting resin composition of claim 2.

11. A printed wiring board, comprising:
the cured product of claim 10.

12. The thermosetting resin composition according to claim 1, further comprising:
a curing agent; and
an inorganic filler.

13. A filling material for a penetrating hole or a recess part in a printed wiring board, comprising:
the thermosetting resin composition of claim 12.

14. A cured product obtained by curing the thermosetting resin composition of claim 12.

15. A printed wiring board, comprising:
the cured product of claim 14.

16. A filling material for a penetrating hole or a recess part in a printed wiring board, comprising:
the thermosetting resin composition of claim 1.

17. A cured product obtained by curing the thermosetting resin composition of claim 16.

18. A printed wiring board, comprising:
the cured product of claim 17.

19. A cured product obtained by curing the thermosetting resin composition of claim 1.

20. A printed wiring board, comprising:
the cured product of claim 19.

* * * * *